(12) United States Patent
Koyo et al.

(10) Patent No.: US 10,600,923 B2
(45) Date of Patent: Mar. 24, 2020

(54) LOW-REFLECTION COATING, GLASS SHEET, GLASS SUBSTRATE, AND PHOTOELECTRIC CONVERSION DEVICE

(71) Applicant: Nippon Sheet Glass Company, Limited, Tokyo (JP)

(72) Inventors: Mizuho Koyo, Hyogo (JP); Mitsuhiro Kawazu, Hyogo (JP)

(73) Assignee: NIPPON SHEET GLASS COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/515,492

(22) PCT Filed: Sep. 25, 2015

(86) PCT No.: PCT/JP2015/004893
§ 371 (c)(1),
(2) Date: Mar. 29, 2017

(87) PCT Pub. No.: WO2016/051750
PCT Pub. Date: Apr. 7, 2016

(65) Prior Publication Data
US 2017/0243989 A1    Aug. 24, 2017

(30) Foreign Application Priority Data

Sep. 30, 2014 (JP) .................. 2014-201590
Jan. 29, 2015 (JP) .................. 2015-015991

(51) Int. Cl.
*H01L 31/0216* (2014.01)
*C09D 7/40* (2018.01)
(Continued)

(52) U.S. Cl.
CPC .......... *H01L 31/02168* (2013.01); *B32B 5/16* (2013.01); *B32B 9/00* (2013.01);
(Continued)

(58) Field of Classification Search
CPC ............. H01L 31/02168; H01L 31/048; H01L 31/0392; C03C 17/3417; C03C 17/007;
(Continued)

(56) References Cited

U.S. PATENT DOCUMENTS

2008/0094326 A1    4/2008  Yamaki et al.
2009/0043025 A1*   2/2009  Tsujimoto ............ C08G 59/306
                                                         524/263

(Continued)

FOREIGN PATENT DOCUMENTS

JP    S58126502    7/1983
JP    H08122501    5/1996

(Continued)

OTHER PUBLICATIONS

Google Patents English translation for Nogami et al (JP H08122501 A) (1996); retrieved Dec. 4, 2017.*

(Continued)

*Primary Examiner* — Nathan L Van Sell
(74) *Attorney, Agent, or Firm* — Hamre, Schumann, Mueller & Larson, P.C.

(57) ABSTRACT

The low-reflection coating of the present invention is adapted to be provided on at least one principal surface of a substrate. The low-reflection coating is a porous film having a thickness of 80 to 800 nm, the porous film including: fine silica particles being solid and spherical and having an average particle diameter of 80 to 600 nm; and a binder containing silica as a main component and containing a hydrophobic group, the fine silica particles being bound by the binder. The low-reflection coating contains 35 to 70 mass % of the fine silica particles, 25 to 64 mass % of the silica of the binder, and 0.2 to 10 mass % of the hydrophobic group (Continued)

of the binder. The low-reflection coating produces a transmittance gain of 1.5% or more when provided on the substrate.

19 Claims, 1 Drawing Sheet

(51) Int. Cl.
    *B32B 5/16*         (2006.01)
    *B32B 9/00*         (2006.01)
    *H01L 31/0392*    (2006.01)
    *C09D 183/02*     (2006.01)
    *C09D 183/04*     (2006.01)
    *G02B 1/18*         (2015.01)
    *G02B 1/111*      (2015.01)
    *C03C 17/00*      (2006.01)
    *C03C 17/34*      (2006.01)
    *H01L 31/048*     (2014.01)

(52) U.S. Cl.
    CPC ........ *C03C 17/007* (2013.01); *C03C 17/3417* (2013.01); *C09D 7/40* (2018.01); *C09D 183/02* (2013.01); *C09D 183/04* (2013.01); *G02B 1/111* (2013.01); *G02B 1/18* (2015.01); *H01L 31/0392* (2013.01); *H01L 31/048* (2013.01); *C03C 2217/211* (2013.01); *C03C 2217/213* (2013.01); *C03C 2217/241* (2013.01); *C03C 2217/732* (2013.01); *C03C 2217/94* (2013.01); *C03C 2218/11* (2013.01); *C03C 2218/32* (2013.01)

(58) Field of Classification Search
    CPC ........... C03C 2217/241; C03C 2218/11; C03C 2217/211; C03C 2218/32; C03C 2217/94; C03C 2217/732; C03C 2217/213; G02B 1/111; G02B 1/18; C09D 183/04; C09D 183/02; C09D 7/40; B32B 9/00; B32B 5/16

See application file for complete search history.

(56) References Cited

U.S. PATENT DOCUMENTS

| | | |
|---|---|---|
| 2010/0136228 A1 | 6/2010 | Richter et al. |
| 2012/0040179 A1* | 2/2012 | Dave ....................... C03C 17/30 428/336 |
| 2012/0244318 A1 | 9/2012 | Koyo et al. |
| 2013/0071649 A1* | 3/2013 | Hager ................. C09D 183/06 428/331 |
| 2013/0163087 A1 | 6/2013 | Lecolley et al. |
| 2014/0178657 A1* | 6/2014 | Jewhurst ................ G02B 1/115 428/212 |
| 2014/0182670 A1* | 7/2014 | Van Duren ............ C09D 5/006 136/256 |
| 2014/0272125 A1* | 9/2014 | Liang ..................... C09D 5/006 427/161 |
| 2015/0079348 A1* | 3/2015 | Mizoshita ............ G02B 5/0226 428/148 |
| 2015/0177425 A1 | 6/2015 | Kondo et al. |

FOREIGN PATENT DOCUMENTS

| | | |
|---|---|---|
| JP | 2006257244 | 9/2006 |
| JP | 2007121786 | 5/2007 |
| JP | 2013113941 | 6/2013 |
| JP | 2013537873 | 10/2013 |
| JP | 2014015543 | 1/2014 |
| JP | 2014032248 | 2/2014 |
| WO | 2006068331 | 6/2006 |
| WO | 2011070714 | 6/2011 |

OTHER PUBLICATIONS

Google Patents English translation for Kajita (JP 2006257244 A) (2006); retrieved Dec. 4, 2017.*
Google Patents English translation for Hyugano et al (JP 2013113941 A) (2013); retrieved Dec. 4, 2017.*
Google Patents English translation for Otani et al (JP 2007121786 A) (2007); retrieved Dec. 4, 2017.*
International Search Report for PCT/JP2015/004893, dated Dec. 22, 2015, 5 pages including English translation.
Extended European Search Report issued for European Patent Application No. 15845953.7, dated May 3, 2018, 8 pages.

* cited by examiner

LOW-REFLECTION COATING, GLASS SHEET, GLASS SUBSTRATE, AND PHOTOELECTRIC CONVERSION DEVICE

TECHNICAL FIELD

The present invention relates to a low-reflection coating, a glass sheet including the low-reflection coating, a glass substrate including the low-reflection coating, and a photoelectric conversion including the low-reflection coating.

BACKGROUND ART

For the purpose of improving the function of a glass or ceramic substrate in its intended use, a low-reflection coating for increasing the amount of light to be transmitted or for preventing glare caused by reflection is formed on the surface of the substrate.

Such low-reflection coatings are formed, for example, on glass sheets for use in vehicle glass panes, show-windows, or photoelectric conversion devices. A so-called thin-film solar cell, which is a type of photoelectric conversion device, employs a glass sheet on which is formed a stack of an underlayer film, a transparent conductive film, a photoelectric conversion layer made of amorphous silicon or the like, and a back-side thin-film electrode that are arranged in this order. A low-reflection coating is formed on the principal surface of the glass sheet opposite to the principal surface bearing the stack, i.e., on the principal surface on which sunlight is incident. Such a solar cell having a low-reflection coating formed on the sunlight-incident side allows an increased amount of sunlight to reach the photoelectric conversion layer or solar cell element and thus generates an increased amount of electricity.

The most commonly used low-reflection coatings are dielectric films formed by, for example, vacuum deposition, sputtering, or chemical vapor deposition (CVD). In some cases, a fine particle-containing film containing fine particles such as fine silica particles is used as a low-reflection coating. Such a fine particle-containing film is formed by applying a coating liquid containing fine particles to a transparent substrate by a technique such as dipping, flow coating, or spraying.

For example, Patent Literature 1 discloses a cover glass for photoelectric conversion devices that is formed by applying a coating liquid containing fine particles and a binder precursor to a glass sheet having surface asperities by spraying, followed by drying at 400° C. and then by calcining at 610° C. for 8 minutes. The low-reflection coating of this cover glass can produce an increase of at least 2.37% in the average transmittance for light in the wavelength range of 380 to 1100 nm.

Furthermore, Patent Literature 2 discloses a coated glass substrate produced by depositing a sol containing tetraethoxysilane, aluminum acetylacetonate, and colloidal silica on a glass sheet by dip coating, followed by heat treatment at 680° C. for 180 seconds. The antireflection layer of this glass substrate produces an increase of 2.5% in the average transmittance for light in the wavelength range of 300 to 1100 nm.

In addition, Patent Literature 3 discloses a silicon substrate with a coating formed by applying a coating composition containing colloidal silica, tetraalkoxysilane, and aluminum nitrate to the silicon substrate using a spin coater and then by drying the applied coating composition at 100° C. for 1 minute, the colloidal silica having a dispersed particle diameter greater than an average primary particle diameter and having a shape factor and aspect ratio that are larger than 1 by a certain amount or more. This coating has a refractive index of 1.40 or less, although there is no mention of the increase in average light transmittance brought about by this coating.

CITATION LIST

Patent Literature

Patent Literature 1: JP 2014-032248 A
Patent Literature 2: JP 2013-537873 A
Patent Literature 3: JP 2014-015543 A

SUMMARY OF INVENTION

Technical Problem

To evaluate the effect of a low-reflection coating, it is important to consider a property called "transmittance gain". The transmittance gain corresponds to an increase in transmittance, such as an increase in average transmittance in a predetermined wavelength range, achieved by formation of the low-reflection coating. Specifically, the transmittance gain is determined as a value obtained by subtracting a transmittance of a substrate unprovided with a coating from a transmittance of the substrate provided with the coating.

For example, in the case of a photoelectric conversion device employing a glass sheet having a light-incident surface provided with a low-reflection coating, a higher transmittance gain means that the glass sheet permits transmission of a larger amount of light and thus the photoelectric conversion device has higher efficiency.

In production of a photoelectric conversion device employing a glass sheet, it has been conventional to provide a low-reflection coating on a glass sheet beforehand and use the glass sheet with the low-reflection coating to produce the photoelectric conversion device. However, in this method, the low-reflection coating provided on the glass sheet may be accidentally damaged or contaminated or suffer from deterioration in low-reflection properties during the production process of the photoelectric conversion device.

When a photoelectric conversion device is actually used, the device is installed outdoors to allow sunlight to be incident on the device. There is thus a problem in that contamination adheres to the photoelectric conversion device due to, for example, rain or sand dust, and such contamination blocks some of the incident light to cause a decrease in the output electricity of the photoelectric conversion device.

Such a problem caused by contamination adhesion to a low-reflection coating can arise also when the low-reflection coating is formed on a substrate other than a glass sheet for use in a photoelectric conversion device.

In view of these circumstances, the present invention aims to provide a low-reflection coating adapted to be provided on a substrate having no other low-reflection coating. In particular, the low-reflection coating is adapted to be provided on a glass substrate forming a light-incident surface of a photoelectric conversion device after assembly of the photoelectric conversion device, and has excellent properties in terms of removal of contamination caused by, for example, rain or sand dust.

Solution to Problem

The present invention provides a low-reflection coating adapted to be provided on at least one principal surface of a substrate, the low-reflection coating being a porous film having a thickness of 80 to 800 nm and including: fine silica particles being solid and spherical and having an average particle diameter of 80 to 600 nm; and a binder containing silica as a main component and containing a hydrophobic group, the fine silica particles being bound by the binder, wherein the fine silica particles are contained in an amount of 35 to 70 mass %, the silica of the binder is contained in an amount of 25 to 64 mass %, the hydrophobic group of the binder is contained in an amount of 0.2 to 10 mass %, and the low-reflection coating produces a transmittance gain of 1.5% or more when provided on the substrate.

The transmittance gain represents an increase in average transmittance of the substrate provided with the low-reflection coating relative to the substrate unprovided with the low-reflection coating, the average transmittance being determined in the wavelength range of 380 to 850 nm.

The present invention also provides a glass sheet including the above low-reflection coating.

The present invention also provides a glass substrate including the above low-reflection coating, the low-reflection coating forming one principal surface of the glass substrate, the glass substrate further including a transparent conductive film forming the other principal surface of the glass substrate opposite to the one principal surface.

The present invention also provides a photoelectric conversion device including:

a glass sheet; and the above low-reflection coating, the low-reflection coating being formed on a principal surface of the glass sheet, wherein the principal surface is a surface on which light is to be incident.

Advantageous Effects of Invention

The above low-reflection coating produces a high transmittance gain by virtue of the fact that the low-reflection coating contains a predetermined amount of solid fine silica particles having an average particle diameter in a predetermined range and a predetermined amount of a binder containing silica as a main component. Furthermore, the low-reflection coating has excellent properties in terms of removal of contamination adhering to the low-reflection coating by virtue of the fact that the binder of the low-reflection coating contains a predetermined amount of a hydrophobic group.

DESCRIPTION OF EMBODIMENTS

The low-reflection coating of the present invention is a low-reflection coating adapted to be provided on at least one surface of a substrate. The low-reflection coating of the present invention is a porous film including: fine silica particles being solid and spherical; and a binder containing silica as a main component, the fine silica particles being bound by the binder. The term "spherical" is used herein to refer to a shape of a fine particle in which the ratio of the largest diameter (D1) of the fine particle to the smallest diameter (Ds) of the fine particle (D1/Ds) is 1.5 or less when the fine particle is observed with a scanning electron microscope (SEM). The binder contains a hydrophobic group. The binder preferably further contains an aluminum compound. The thickness of the porous film is, for example, 80 to 800 nm, preferably 100 to 500 nm, and more preferably more than 100 nm and not more than 150 nm.

The fine silica particles are spherical primary particles having an average particle diameter of, for example, 80 to 600 nm, preferably 100 to 500 nm, more preferably more than 100 nm and not more than 150 nm. Silica has higher hardness than organic polymer materials. In addition, silica has a relatively low refractive index, thus being capable of offering a reduction in the apparent refractive index of the porous film including the binder and the fine silica particles. Furthermore, spherical primary particles made of silica and having uniform diameters are commercially manufactured at low cost and are highly available in terms of the quantity, quality, and cost. The "average particle diameter" as defined herein is determined by observation of a cross-section of the low-reflection coating with a scanning electron microscope (SEM). Specifically, 50 particles the entirety of each of which is observable are randomly selected, the largest and smallest diameters of each particle are measured, the average of the largest and smallest diameters is determined as the particle diameter of the particle, and the average of the particle diameters of the 50 particles is determined as the "average particle diameter".

The content of the fine silica particles in the low-reflection coating is, for example, 35 to 70 mass %. In one aspect, the content of the fine silica particles in the low-reflection coating is preferably 50 to 70 mass % and more preferably 55 to 65 mass %. In another aspect, the content of the fine silica particles in the low-reflection coating is preferably 35 to 55 mass % and more preferably 40 to 55 mass %. The content of the silica of the binder in the low-reflection coating is, for example, 25 to 64 mass %. In one aspect, the content of the silica of the binder is preferably 25 to 40 mass % and more preferably 28 to 38 mass %. In another aspect, the content of the silica of the binder is preferably 35 to 60 mass % and more preferably 40 to 55 mass %. The term "silica" is used herein to refer to a substance composed only of silicon atoms and oxygen atoms directly bonded to the silicon atoms.

The content of the hydrophobic group in the low-reflection coating is, for example, 0.2 to 10 mass % and preferably 0.5 to 8 mass % and, in some cases, is preferably 1 to 6 mass % and more preferably 3 to 6 mass %. In this case, the contact angle of a water droplet on the low-reflection coating can be increased to, for example, 70° or more, preferably 80° or more, more preferably 85° or more. This means that the low-reflection coating has good contamination removal properties. When the content of the hydrophobic group of the binder is 1 mass % or more, the low-reflection coating has high chemical durability.

The low-reflection coating of the present invention produces a transmittance gain of, for example, 1.5% or more, preferably 2.0% or more, more preferably 2.2% or more. The transmittance gain represents an increase in average transmittance of a substrate provided with the low-reflection coating relative to the substrate unprovided with the low-reflection coating, the average transmittance being determined in the wavelength range of 380 to 850 nm. This transmittance gain is determined by subtracting the average transmittance of a substrate unprovided with the low-reflection coating in the wavelength range of 380 to 850 nm from the average transmittance of the substrate provided with the low-reflection coating in the wavelength range of 380 to 850 nm. For this purpose, light is made incident on the low-reflection coating on the substrate provided with the low-reflection coating, and light is made incident on that surface of the substrate unprovided with the low-reflection coating on which the low-reflection coating is to be formed.

It is preferable that the hydrophobic group of the binder be derived from a hydrolyzable silicon compound, or a hydrolysate of the hydrolyzable silicon compound, added to a coating liquid for forming the low-reflection coating, and that the hydrolyzable silicon compound have a hydrophobic group directly bonded to silicon. For example, this hydrolyzable silicon compound includes a compound represented by the formula (II) below. In the formula (II), Y represents a hydrolyzable group, which is preferably at least one selected from the group consisting of an alkoxy group, an acetoxy group, an alkenyloxy group, an amino group, and a halogen atom. In the formula (II), R represents a hydrophobic group, which is preferably a chain or cyclic alkyl group that has 1 to 30 carbon atoms and at least one of whose hydrogen atoms is optionally substituted by a fluorine atom, more preferably a chain alkyl group, even more preferably a chain alkyl group having 1 to 3 carbon atoms, and particularly preferably a methyl group.

$$RSiY_3 \qquad (II)$$

Preferably, when an aqueous suspension of simulated dust is applied to a substrate provided with the low-reflection coating of the present invention and is dried to produce simulated contamination, the simulated contamination can be wiped off by rubbing with a dry cloth to the degree that the simulated contamination becomes invisible to naked eyes.

In the low-reflection coating, the ratio between the content of the fine silica particles and the content of a hydrolysis condensation product of the hydrolyzable silicon compound (content of fine silica particles:content of hydrolysis condensation product of hydrolyzable silicon compound), as expressed by mass ratio, is in the range of 70:30 to 30:70, for example. In one aspect, the ratio is preferably in the range of 65:35 to 50:50. In another aspect, the ratio is preferably in the range of 60:40 to 40:60. The higher the content ratio of the fine silica particles is, the greater the transmittance gain produced by the low-reflection coating of the present invention is. This is due to an increase in the spacing between the fine silica particles themselves or between the fine particles and a substrate such as a transparent substrate. If, however, the content ratio of the fine silica particles is excessively large, the durability of the low-reflection coating will deteriorate. This is because an excessively large content ratio of the fine silica particles results in a reduction in the effect of that silica of the binder which serves to bond the fine silica particles together or bond the fine particles to a substrate such as a transparent substrate. If the content ratio of the fine silica particles is excessively small, the spacing mentioned above will be too narrow, with the result that the transmittance gain produced by the low-reflection coating will decrease.

When an aluminum compound is contained in the low-reflection coating, the aluminum compound is preferably derived from a water-soluble inorganic aluminum compound added to a coating liquid for forming the low-reflection coating and is more preferably derived from an aluminum halide or aluminum nitrate added to the coating liquid. In this case, the aluminum halide is preferably aluminum chloride. In the low-reflection coating, the content of the aluminum compound, calculated as $Al_2O_3$, is, for example, 2 to 7 mass % and preferably 4 to 7 mass %. When the aluminum compound is contained in the low-reflection coating in an amount to give the above content, the low-reflection coating has an increased chemical durability. If the content of the aluminum compound is less than 2 mass %, the chemical durability of the low-reflection coating will deteriorate. If the content of the aluminum compound is more than 7 mass %, the transmittance gain produced by the low-reflection coating will decrease.

The low-reflection coating may further contain another additive. Examples of the other additive include a titanium compound and a zirconium compound. For example, when the low-reflection coating contains such an additive, the low-reflection coating can have an increased resistance to alkali. The low-reflection coating may contain, for example, 0.1 to 5 mass % of a phosphorus compound calculated as $P_2O_5$.

The silica of the binder is derived, for example, from a hydrolyzable silicon compound, or a hydrolysate of the hydrolyzable silicon compound, added to a low-reflection coating liquid for forming the low-reflection coating. For example, this hydrolyzable silicon compound includes a compound represented by the formula (I) below. In the formula (I), X is at least one selected from the group consisting of an alkoxy group, an acetoxy group, an alkenyloxy group, an amino group, and a halogen atom.

$$SiX_4 \qquad (I)$$

Hydrolyzable silicon compounds described herein include oligomers of hydrolyzable silicon compounds. Such an oligomer is formed, for example, by condensation of about 2 to 200 identical molecules.

Hydrolyzable silicon compounds typified by silicon alkoxides can be used as a source of the silica of the binder. Examples of the silicon alkoxides include tetramethoxysilane, tetraethoxysilane, and tetraisopropoxysilane. Any of these hydrolyzable silicon compounds undergoes hydrolysis and polycondensation according to a so-called sol-gel process to form the binder.

The hydrolysis of the hydrolyzable silicon compound can be carried out in any appropriate manner. The hydrolysis is preferably carried out in a solution containing the fine silica particles, because this promotes a polycondensation reaction between silanol groups present on the surfaces of the fine silica particles and silanol groups formed by hydrolysis of the hydrolyzable silicon compound such as a silicon alkoxide, thus leading to an increase in the proportion of the binder contributing to enhancement of bond strength between the fine silica particles. Specifically, it is preferable to prepare a coating liquid by sequentially adding a hydrolysis catalyst and then a silicon alkoxide to a solution containing the fine silica particles while stirring the solution. The silicon alkoxide may be a monomer or may be an oligomer. Either an acid or a base can be used as the hydrolysis catalyst. It is preferable to use an acid, in particular an acid having a high degree of electrolytic dissociation in an aqueous solution. Specifically, it is preferable to use an acid having an acid dissociation constant pKa (which refers to the first acid dissociation constant when the acid is a polybasic acid) of 2.5 or less. Preferred examples of the acid include: volatile inorganic acids such as hydrochloric acid and nitric acid; organic acids such as trifluoroacetic acid, methanesulfonic acid, benzenesulfonic acid, and p-toluenesulfonic acid; and polybasic acids such as maleic acid, phosphoric acid, and oxalic acid. Acidic conditions allow better dispersion of the fine silica particles and yield higher stability of the coating liquid than basic conditions.

Furthermore, chlorine ions derived from hydrochloric acid contribute to an increase in the chlorine ion content in the coating liquid and thus enhance the effect brought about by the above-mentioned aluminum chloride added to the coating liquid.

Consequently, the low-reflection coating of the present invention can produce a transmittance gain as high as, for example, 1.5% or more, preferably 2.5% or more, more preferably 2.6% or more and exhibit high chemical durability as described above.

When the low-reflection coating contains 35 to 55 mass % of the fine silica particles and 35 to 60 mass % of the silica of the binder, the absolute value of the difference between a first average transmittance of a substrate provided with the low-reflection coating and a second average transmittance of the substrate provided with the low-reflection coating is, for example, 0.25% or less. The first average transmittance is determined for light in the wavelength range of 380 to 850 nm after the substrate provided with the low-reflection coating is subjected to a chemical durability test described below, while the second average transmittance is determined for light in the wavelength range of 380 to 850 nm before the chemical durability test. The chemical durability test is specifically a salt spray test performed by spraying a 5 mass % aqueous sodium chloride solution having a temperature of 35° C. onto the low-reflection coating for 192 hours according to JIS (Japanese Industrial Standards) C 8917: 2005, Annex 4. The average transmittance for light in the wavelength range of 380 to 850 nm is an arithmetic mean of values of the transmittance for light in the wavelength range of 380 to 850 nm. As can be understood from the foregoing, the low-reflection coating in an embodiment can have high chemical durability.

When the low-reflection coating contains 35 to 55 mass % of the fine silica particles and 35 to 60 mass % of the silica of the binder, a reflectance loss determined as described below after a reciprocating wear test is, for example, 1.6% or more and preferably 2.0% or more. The reflectance loss is determined by subtracting an average reflectance of a substrate provided with the low-reflection coating for light in the wavelength range of 360 to 740 nm from an average reflectance of the substrate unprovided with the low-reflection coating for light in the wavelength range of 360 to 740 nm, the average reflectance of the substrate provided with the low-reflection coating being determined after the substrate provided with the low-reflection coating is subjected to the reciprocating wear test, which is performed by moving an abrasive wheel, CS-10F, in contact with the low-reflection coating at a load of 4 N with 50 cycles of reciprocation. As can be understood from the foregoing, the low-reflection coating in an embodiment can have high wear resistance as well as high chemical durability.

The low-reflection coating of the present invention can be formed, for example, by applying, drying, and curing a coating liquid. For application of the coating liquid, any of known methods such as spin coating, roll coating, bar coating, dip coating, and spray coating can be used. Spray coating is advantageous in terms of mass production. Roll coating or bar coating is more suitable in terms of the uniformity of the visual appearance of the low-reflection coating, as well as in terms of mass production.

The low-reflection coating is preferably formed by applying a coating liquid for forming the low-reflection coating to a substrate and then heating the substrate so that the substrate has a maximum temperature of 200° C. or higher and 350° C. or lower and that a duration during which the substrate has a temperature of 200° C. or higher is 5 minutes or less. The low-reflection coating is more preferably formed by applying a coating liquid for forming the low-reflection coating to a substrate and then heating the substrate so that the substrate has a maximum temperature of 120° C. or higher and 250° C. or lower and that a duration during which the substrate has a temperature of 120° C. or higher is 3 minutes or less. The low-reflection coating is even more preferably formed by applying a coating liquid for forming the low-reflection coating to a substrate and then heating the substrate so that the substrate has a maximum temperature of 100° C. or higher and 250° C. or lower and that a duration during which the substrate has a temperature of 100° C. or higher is 2 minutes or less. Thus, in an embodiment, the low-reflection coating of the present invention can be formed by heating at a relatively low temperature. Besides this, good contamination removal properties, high transmittance gain, high wear resistance, and high chemical durability, which have been described above, can be achieved. The drying and curing of the low-reflection coating can be accomplished, for example, by hot air drying.

The substrate suitable for being provided with the low-reflection coating of the present invention may be a glass sheet having no coating. That is, the present invention makes it possible to obtain a glass sheet including the above low-reflection coating. The glass sheet may be a float glass sheet having a principal surface having smoothness such that the arithmetic average roughness Ra of the principal surface is, for example, 1 nm or less and preferably 0.5 nm or less. The arithmetic average roughness Ra as defined herein corresponds to that as specified in JIS B 0601-1994.

The glass sheet used may also be a figured glass sheet having a surface with asperities. The mean spacing Sm of the asperities is, for example, 0.3 mm or more, preferably 0.4 mm or more, and more preferably 0.45 mm or more, and is, for example, 2.5 mm or less, preferably 2.1 mm or less, more preferably 2.0 mm or less, and particularly preferably 1.5 mm or less. The mean spacing Sm as defined herein refers to an average of lengths of peak-valley periods in a roughness profile which are determined based on points at which the roughness profile intersects the mean line. It is further preferable that the surface asperities of the figured glass sheet have a maximum height Ry of 0.5 μm to 10 μm, in particular 1 μm to 8 μm, in addition to a mean spacing Sm within the above range. The mean spacing Sm and maximum height Ry as defined herein correspond to those as specified in JIS B 0601-1994.

The glass sheet used may have a composition similar to those of typical figured glass sheets or architectural glass sheets, and is preferably as free of coloring components as possible. In the glass sheet, the content of iron oxide, which is a typical coloring component, is preferably 0.06 mass % or less and particularly preferably 0.02 mass % or less when calculated as $Fe_2O_3$ content.

Furthermore, the substrate suitable for being provided with the low-reflection coating of the present invention may be a transparent conductive film-coated glass substrate. The transparent conductive film-coated glass substrate is, for example, a glass substrate having a transparent conductive film formed on one principal surface of any of the glass sheets as described above, the glass substrate including one or more underlayers and a transparent conductive layer containing, for example, fluorine-doped tin oxide as a main component, the layers being stacked in order on the principal surface of the glass sheet. In this case, the transparent conductive film lies on the principal surface of the glass sheet opposite to the principal surface on which the low-reflection coating is to be formed. For example, when the glass sheet is one produced by a float process, the low-reflection coating is preferably formed on the bottom surface of the glass sheet that is a principal surface formed of glass that has been in contact with a molten tin in a float bath. The transparent conductive film is preferably formed on the top surface of the glass sheet that is a principal surface formed of glass that has not been in contact with the molten tin in the float bath. Thus, the present invention makes it possible to obtain a glass substrate including the above low-reflection coating, the low-reflection coating forming one principal surface of the glass substrate, the glass substrate further including a transparent conductive film forming the other principal surface of the glass substrate opposite to the one principal surface.

The present invention also makes it possible to obtain a photoelectric conversion device including a glass sheet and the above low-reflection coating formed on that principal surface of the glass sheet on which light is to be incident.

EXAMPLES

Hereinafter, the present invention will be described in more detail with reference to examples. The methods used in Examples and Comparative Examples for evaluation of various properties of each low-reflection coating formed on a substrate will first be described.

(Light Transmission Properties)

The transmission curve (transmission spectrum) of the substrate was measured using a spectrophotometer (UV-3100PC, manufactured by Shimadzu Corporation) before and after low-reflection coating formation. The average transmittance was calculated by averaging the values of transmittance over the wavelength range of 380 to 850 nm. The increase in average transmittance of the substrate provided with a low-reflection coating relative to the substrate unprovided with the low-reflection coating was defined as the transmittance gain. The results for Examples 1 to 11 and Comparative Example 2 are shown in Table 1.

(Contamination Removal Properties)

Contamination removal properties were evaluated as follows: Certain simulated contamination was produced on the surface of the low-reflection coating and rubbed with a dry cloth. After that, whether the simulated contamination was successfully wiped off was examined with the naked eye, and whether scratches were formed on the low-reflection coating was then examined using an optical microscope at a magnification of 100. The simulated contamination was produced by applying and drying an aqueous suspension of certain simulated dust. The simulated dust used was "Kanto Loam" (manufactured by The Association of Powder Process Industry and Engineering, JAPAN) specified as Class 7 of Test Powders 1 in JIS Z 8901 ("Test powders and test particles"), and the suspension of the dust was prepared by suspending the dust in a volume of water equivalent to 4 times the mass of the dust. The simulated contamination was produced by placing a drop of 0.5 ml of the suspension onto the test sample held horizontally and then leaving the test sample in air for 16 hours. The results for Examples and Comparative Examples are shown in Table 1.

For each of Examples and Comparative Examples, a difference between an average transmittance exhibited after wiping off of the simulated contamination from the low-reflection coating and an average transmittance exhibited before adhesion of the simulated contamination to the low-reflection coating was determined by subtracting the latter from the former, using a spectrophotometer (UV-3100PC, manufactured by Shimadzu Corporation). The results are shown in Table 1.

(Resistance to Contamination Adhesion)

The resistance to contamination adhesion was evaluated by allowing a dust suspension to run down, and dry on, the surface of the low-reflection coating and then examining the surface for the presence of remaining simulated contamination with the naked eye. The dust suspension used was identical to that used in the above evaluation of the contamination removal properties. The dust suspension in an amount of 1 ml was applied from a dropper onto the test sample inclined at an angle of 45° and was thus allowed to run down the sample. The sample was left in air for 16 hours and then examined. The results for Examples and Comparative Examples are shown in Table 1.

(Contact Angle)

About 4 μL of water droplet was placed on the surface of each of the low-reflection coatings according to Examples and Comparative Example 2 or on the surface of a glass substrate used as Comparative Example 1, and the contact angle of the water droplet on the surface was measured using a contact angle meter manufactured by Kyowa Interface Science Co., Ltd. (model: CA-A). The results for Examples and Comparative Examples are shown in Table 1.

(Wear Resistance)

Low-reflection coated substrates according to Examples 4 to 11 and Comparative Example 2 were subjected to a reciprocating wear test using a reciprocating wear tester manufactured by DAIEI KAGAKU SEIKI MFG. CO., LTD. Specifically, each low-reflection coated substrate was fixed by a jig, with the low-reflection coating facing upward. Next, a circular abrasive wheel of 19 mm diameter, CS-10F, was brought into contact, at its circular face, with the low-reflection coating, and a load of 4 N was applied. The area of contact between the abrasive wheel, CS-10F, and the low-reflection coating was 284 $mm^2$. In this state, the abrasive wheel, CS-10F, was moved straight back and forth 50 times on the low-reflection coating. The velocity of the abrasive wheel was set to 120 mm/sec, and the stroke width of the abrasive wheel was set to 120 mm.

For each of the low-reflection coated substrates according to Examples 4 to 11 and Comparative Example 2, the values of reflectance for light in the wavelength range of 360 nm to 740 nm were measured using a spectrocolorimeter (CM-2600d, manufactured by KONICA MINOLTA, INC.), and the values of reflectance in this wavelength range were averaged to determine an average reflectance. The average reflectance determination was made before and after the reciprocating wear test for each of the low-reflection coated substrates according to Examples 4 to 11 and Comparative Example 2. In addition, the average reflectance determination was made for each of the substrates used in Examples 4 to 11 and Comparative Example 2 also before low-reflection coating formation in the same manner as above. In each of Examples 4 to 11 and Comparative Example 2, the average reflectance determined for the low-reflection coated substrate before the reciprocating wear test was subtracted from the average reflectance determined for the substrate before low-reflection coating formation to determine a reflectance loss before the reciprocating wear test. In each of Examples 4 to 11 and Comparative Example 2, the average reflectance determined for the low-reflection coated substrate after the reciprocating wear test was subtracted from the average reflectance determined for the substrate before low-reflection coating formation to determine a reflectance loss after the reciprocating wear test. For the reflectance measurement, light was made incident on the low-reflection coating or on that surface of the substrate on which the low-reflection coating was to be formed. The results are shown in Table 1.

(Chemical Durability)

For each of the low-reflection coated substrates according to Examples 4, 5, and 9 and Comparative Example 2, the chemical durability of the low-reflection coating was evaluated as follows. First, a 5 mass % aqueous sodium chloride solution having a temperature of 35° C. was prepared. A salt spray test was then performed by spraying the aqueous sodium chloride solution onto the low-reflection coating of the low-reflection coated substrate for 192 hours according to JIS C 8917: 2005, Annex 4. Before and after the salt spray test, the average transmittance of the low-reflection coated substrate for light in the wavelength range of 380 to 850 nm was determined using a spectrophotometer (UV-3100PC, manufactured by Shimadzu Corporation). This was followed by calculation of the absolute value of the difference between the average transmittance of the low-reflection coated substrate determined for light in the wavelength range of 380 to 850 nm after the salt spray test and the average transmittance of the low-reflection coated substrate determined for light in the wavelength range of 380 to 850 nm before the salt spray test. The results are shown in Table 1.

(Thickness)

Figure 1:
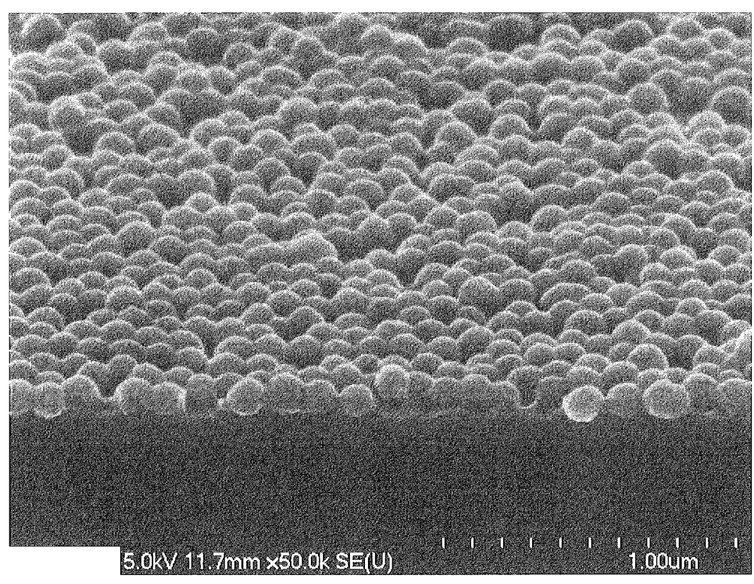
FIG. 1 is a FE-SEM (field emission scanning electron microscope) photograph of a low-reflection coated glass sheet according to Example 4.

Each of the low-reflection coatings according to Examples and Comparative Examples was observed with a field emission scanning electron microscope (FE-SEM) manufactured by Hitachi, Ltd. (model: S-4500). The thickness of the low-reflection coating was measured at five points in a FE-SEM photograph, taken from above at an angle of 30°, of a cross-section of the low-reflection coating, and the average of the measured values was calculated as the thickness (average thickness) of the low-reflection coating. A FE-SEM photograph of the low-reflection coated glass sheet according to Example 4 is shown in FIG. 1.

Example 1

(Preparation of Coating Liquid)

An amount of 56.2 parts by mass of a fine silica particle dispersion (Quartron PL-7, manufactured by FUSO CHEMICAL CO., LTD., containing approximately spherical primary particles with an average particle diameter of 125 nm, and having a solids concentration of 23 wt %), 23.3 parts by mass of 1-methoxy-2-propanol (solvent), and 1 part by mass of 1N hydrochloric acid (hydrolysis catalyst) were mixed by stirring, and 12.1 parts by mass of tetraethoxysilane (ethyl orthosilicate, manufactured by TAMA CHEMICALS CO., LTD.) and 7.1 parts by mass of methyltriethoxysilane (manufactured by Shin-Etsu Chemical Co., Ltd.) were added to the mixture under continuous stirring. The stirring was continued for additional 8 hours while maintaining a temperature of 40° C. to hydrolyze tetraethoxysilane and methyltriethoxysilane, thus yielding a raw material liquid A. In the raw material liquid A, the ratio between the mass of the fine silica particles and the mass of hydrolysis condensation products of hydrolyzable silicon compounds contained in the binder was 67.7:32.3, and the amount of the hydrolysis condensation product of the hydrolyzable silicon compound having a hydrophobic group was 43.4 parts by mass with respect to 100 parts by mass of the total hydrolysis condensation products of the hydrolyzable silicon compounds.

An amount of 52.5 g of the raw material liquid A, 3.0 g of propylene glycol (solvent), 92.0 g of 1-methoxy-2-propanol (solvent), and 2.49 g of an aqueous aluminum chloride solution (an aqueous solution having an $AlCl_3$ concentration of 47.6 wt % and prepared by dissolving reagent grade aluminum chloride hexahydrate (manufactured by Sigma-Aldrich Co., LLC.) in deionized water) were mixed by stirring to obtain a coating liquid A1. In the coating liquid A1, the concentration of solids (derived from the fine silica particles and alkoxysilanes) calculated as silica ($SiO_2$) was 7.0 mass %, the amount of the aluminum compound calculated as $Al_2O_3$ was 5 parts by mass with respect to 100 parts by mass of silicon oxide calculated as $SiO_2$, and the content of the hydrophobic group in the solids of the coating liquid A1 was 2.8 mass %.

(Formation of Low-Reflection Coating)

A low-reflection coating was formed on that principal surface of a transparent conductive film-coated glass sheet on which the transparent conductive film was not formed. This transparent conductive film-coated glass sheet was a 3.2-mm-thick glass sheet manufactured by Nippon Sheet Glass Co., Ltd. The transparent conductive film-coated glass sheet includes: a glass sheet having a typical soda-lime-silicate composition; and a transparent conductive film formed on one principal surface of the glass sheet by on-line CVD and including a transparent conductive layer. As can be understood from the fact that the transparent conductive film of the coated glass sheet is one formed by on-line CVD, the glass sheet coated with the transparent conductive film is a glass sheet produced by a float process. The transparent conductive film lay on the top surface of the glass sheet that was a principal surface formed of glass that had not been in contact with a molten tin in a float bath. This transparent conductive film-coated glass sheet was cut into a 200 mm×300 mm piece, which was immersed in an alkaline solution (LBC-1, an alkaline cleaning liquid, manufactured by LEYBOLD CO., LTD.) and then washed using an ultrasonic cleaner. The piece of glass sheet was rinsed with deionized water and then dried at ordinary temperature. A glass sheet (substrate) for low-reflection coating formation was thus prepared. The light transmission properties of this glass sheet unprovided with a low-reflection coating were evaluated in the manner described above, and the average transmittance was determined to be 80.0%.

The coating liquid A1 was applied using a roll coater to that principal surface of the above glass sheet which was not coated with the transparent conductive film. The application of the coating liquid was done in such a manner that the applied liquid formed a film having a thickness of 1 to 5 μm. The coating liquid applied to the glass sheet was then dried and cured by hot air. This hot air drying was performed by using a belt conveyor-type hot air dryer and moving the conveyor back and forth twice to pass the glass sheet under a hot air injection nozzle four times, with the temperature of hot air set to 300° C., the distance between the nozzle and glass sheet set to 5 mm, and the conveyance speed set to 0.5 m/min. In this drying, the duration during which the glass sheet coated with the coating liquid was in contact with hot air was 140 seconds, and the maximum temperature reached by the glass surface coated with the coating liquid was 199° C. The duration during which the temperature of the glass surface coated with the coating liquid was 120° C. or higher was 125 seconds. The glass sheet having undergone the drying and curing was left to cool to room temperature. In this way, a low-reflection coating was provided on the glass sheet. It should be understood from the foregoing that in Example 1, the low-reflection coating was formed on the bottom surface of the glass sheet that was a principal surface formed of glass that had been in contact with a molten tin in a float bath.

The above various properties of the thus obtained low-reflection coating according to Example 1 were evaluated. The results are shown in Table 1.

Example 2

(Preparation of Coating Liquid)

An amount of 28.3 parts by mass of a fine silica particle dispersion identical to that used in Example 1, 58.6 parts by mass of 1-methoxy-2-propanol (solvent), and 1 part by mass of 1N hydrochloric acid (hydrolysis catalyst) were mixed by stirring, and 12.1 parts by weight of tetraethoxysilane (ethyl orthosilicate, manufactured by TAMA CHEMICALS CO., LTD.) was added to the mixture under continuous stirring. The stirring was continued for additional 8 hours while maintaining a temperature of 40° C. to hydrolyze tetraethoxysilane, thus yielding a raw material liquid B. In the raw material liquid B, the ratio between the mass of the fine silica particles calculated as $SiO_2$ and the mass of silicon oxide components of the binder calculated as $SiO_2$ was 65:35, and the concentration of solids calculated as $SiO_2$ was 10 mass %. The raw material liquid B contained no hydrophobic group.

An amount of 70.0 g of the raw material liquid B, 2.0 g of propylene glycol (solvent), 26.3 g of 1-methoxy-2-propanol (solvent), and 1.7 g of an aqueous aluminum chloride solution identical to that used in Example 1, and 0.09 g of decyltrimethoxysilane (manufactured by Shin-Etsu Chemical Co., Ltd.) were mixed by stirring to obtain a coating liquid B2. In the coating liquid B2, the concentration of solids (derived from the fine silica particles and alkoxysilane) calculated as silica ($SiO_2$) was 7.0 mass %, the amount of the aluminum compound calculated as $Al_2O_3$ was 5 parts by mass with respect to 100 parts by mass of silicon oxide calculated as $SiO_2$, and the content of the hydrophobic group in the solids of the coating liquid B2 was 0.6 mass %.

(Formation of Low-Reflection Film)

A low-reflection coating was provided on a glass sheet in the same manner as in Example 1, except for using the coating liquid B2 instead of the coating liquid A1, and the above various properties were evaluated. The results are shown in Table 1.

Comparative Example 1

A transparent conductive film-coated glass sheet identical to that used in Examples 1 and 2 was used as Comparative Example 1 without the formation of a low-reflection coating on the principal surface on which the transparent conductive film was not formed. In advance of evaluation, the glass sheet was washed and dried as in Examples 1 and 2. The evaluation results are shown in Table 1.

As demonstrated by Examples 1 and 2, the low-reflection coatings finished only through curing by hot air drying yielded a considerably high transmittance gain of 2.5% or more and showed good contamination removal properties. Furthermore, the low-reflection coating of Example 2 successfully attained good scratch resistance comparable to that of the surface of the glass substrate unprovided with the coating.

Example 4

An amount of 21.7 parts by mass of a fine silica particle dispersion (Quartron PL-7, manufactured by FUSO CHEMICAL CO., LTD., containing approximately spherical primary particles with an average particle diameter of 125 nm, and having a solids concentration of 23 wt %), 64.5 parts by mass of 1-methoxy-2-propanol (solvent), and 1 part by mass of 1N hydrochloric acid (hydrolysis catalyst) were mixed by stirring, and 7.7 parts by mass of a partial hydrolysis condensation product of tetraethoxysilane (an oligomer composed of five monomer units on average, manufactured by COLCOAT CO., LTD. under the trade name "Ethyl Silicate 40" which is abbreviated as "ES-40") and 5.1 parts by mass of methyltriethoxysilane (manufactured by Shin-Etsu Chemical Co., Ltd.) were added to the mixture under continuous stirring. The stirring was continued for additional 8 hours while maintaining a temperature of 40° C. to hydrolyze ES-40 and methyltriethoxysilane, thus yielding a raw material liquid C.

An amount of 70.0 g of the raw material liquid C, 2.0 g of propylene glycol (solvent), 25.9 g of 1-methoxy-2-propanol (solvent), and 2.1 g of an aqueous aluminum chloride solution (an aqueous solution having an $AlCl_3$ concentration of 47.6 wt % and prepared by dissolving reagent grade aluminum chloride hexahydrate (manufactured by Sigma-Aldrich Co., LLC.) in deionized water) were mixed by stirring to obtain a coating liquid C1. In the coating liquid C1, the concentration of solids (derived from the fine silica particles, ES-40, and methyltriethoxysilane) calculated as silicon oxide was 7 mass %.

A low-reflection coating was provided on a glass sheet in the same manner as in Example 1, except for using the coating liquid C1 instead of the coating liquid A1, and the above various properties were evaluated. The contents of the components in the low-reflection coating formed from the coating liquid C1 were as follows.

| | |
|---|---|
| Fine silica particles | 47.1 mass % |
| Silica of binder | 43.0 mass % |
| Hydrophobic group | 4.0 mass % |
| Aluminum compound calculated as $Al_2O_3$ | 5.9 mass % |

In the low-reflection coating formed from the coating liquid C1, the ratio between the content of the fine silica particles and the content of the hydrolysis condensation products of the hydrolyzable silicon compounds was 50:50 as expressed by mass ratio.

Examples 3 and 5 to 8

Coating liquids according to Examples 3 and 5 to 8 were prepared in the same manner as in Example 4, except for adjusting the amounts of the added materials so that the content of the fine silica particles, the content of the silica of the binder, the content of the hydrophobic group, and the content of the aluminum compound calculated as $Al_2O_3$ in the resulting low-reflection coating were as shown in Table 1. The solids concentration in each of the coating liquids according to Examples 3 and 5 to 8 was 7 mass %. Low-reflection coated glass sheets according to Examples 3 and 5 to 8 were fabricated in the same manner as in Example 1, except for using the coating liquids according to Examples 3 and 5 to 8 instead of the coating liquid A1.

Example 9

An amount of 26.1 parts by mass of a fine silica particle dispersion identical to that used in Example 1, 58.7 parts by mass of 1-methoxy-2-propanol (solvent), and 5 parts by mass of an aqueous phosphoric acid solution (a 9.0 mass % aqueous solution prepared by dissolving phosphoric acid (manufactured by Tokyo Chemical Industry Co., Ltd. and having a concentration of 89 mass % or more) in deionized water) were mixed by stirring, and 6.2 parts by mass of ES-40 as used above and 4.0 parts by mass of methyltriethoxysilane were added to the mixture under continuous stirring, thus yielding a raw material liquid D. A coating liquid D1 was then obtained in the same manner as in Example 4, except for using the raw material liquid D instead of the raw material liquid C. A low-reflection coating was provided on a glass sheet in the same manner as in Example 1, except for using the coating liquid D1 instead of the coating liquid A1. A low-reflection coated glass sheet according to Example 9 was thus fabricated.

Example 10

A raw material liquid E was obtained in the same manner as in Example 9, except that the amount of 1-methoxy-2-propanol (solvent) added was changed to 62.7 parts by mass and that 1.0 part by mass of an aqueous trifluoroacetic acid solution (an aqueous solution prepared by dissolving 10 g of trifluoroacetic acid (manufactured by Tokyo Chemical Industry Co., Ltd.) in 90 g of deionized water) was used instead of the aqueous phosphoric acid solution. A coating liquid E1 was then obtained in the same manner as in Example 4, except for using the raw material liquid E instead of the raw material liquid C. A low-reflection coating was provided on a glass sheet in the same manner as in Example 1, except for using the coating liquid E1 instead of the coating liquid A1. A low-reflection coated glass sheet according to Example 10 was thus fabricated.

Example 11

A raw material liquid F was obtained in the same manner as in Example 10, except that 1.0 part by mass of an aqueous oxalic acid solution (an aqueous solution prepared by dissolving 10 g of oxalic acid dihydrate (manufactured by KANTO CHEMICAL CO., INC.) in 90 g of deionized water to give an oxalic acid concentration of 7.1 mass %) was used instead of the aqueous trifluoroacetic acid solution. A coating liquid F1 was then obtained in the same manner as in Example 4, except for using the raw material liquid F instead of the raw material liquid C. A low-reflection coating was provided on a glass sheet in the same manner as in Example 1, except for using the coating liquid F1 instead of the coating liquid A1. A low-reflection coated glass sheet according to Example 11 was thus fabricated.

Comparative Example 2

A coating liquid according to Comparative Example 2 was prepared in the same manner as in Example 4, except that methyltriethoxysilane was not used and that the amounts of the added materials were adjusted so that the contents of the components in the solids of the coating liquid according to Comparative Example 2 were as shown in Table 1. The solids concentration in the coating liquid according to Comparative Example 2 was 7 mass %. A low-reflection coated glass sheet according to Comparative Example 2 was fabricated in the same manner as in Example 1, except for using the coating liquid according to Comparative Example 2 instead of the coating liquid A1.

As shown in Table 1, the contact angle on the low-reflection coating according to Comparative Example 2 was 6.6°, while the contact angle on the low-reflection coatings according to Examples 3 to 11 was 79.8° or more. This demonstrates that a low-reflection coating resistant to contamination adhesion and having good contamination removal properties can be obtained when the binder of the low-reflection coating contains a hydrophobic group in a predetermined amount. The low-reflection coatings according to Examples 3 to 8 produced a relatively high transmittance gain, which was 2.24 or more. For the low-reflection coating according to Comparative Example 2, the reflectance loss determined after the reciprocating wear test was 1.55, while for the low-reflection coatings according to Examples 4 to 8, the reflectance loss determined after the reciprocating wear test was 2.33 or more. This demonstrates that the low-reflection coatings according to Examples 4 to 8 had good wear resistance. For the low-reflection coating according to Comparative Example 2, the absolute value of the difference in average transmittance before and after the salt spray test was 0.27, while the absolute value of the difference in average transmittance before and after the salt spray test was 0.11 for the low-reflection coating according to Example 4 and 0.20 for the low-reflection coating according to Example 5. This demonstrates that the low-reflection coatings according to Examples 4 and 5 had good chemical durability.

TABLE 1

| | | Example 1 | Example 2 | Example 3 | Example 4 | Example 5 | Example 6 | Example 7 | Example 8 | Example 9 | Example 10 | Example 11 | Comp. Example 1 | Comp. Example 2 |
|---|---|---|---|---|---|---|---|---|---|---|---|---|---|---|
| Low-reflection coating | Fine silica particles [mass %] | 64.5 | 61.9 | 62.1 | 47.0 | 47.0 | 47.6 | 42.3 | 42.9 | 56.5 | 56.5 | 56.5 | — | 61.9 |
| | Binder — Silica [mass %] | 27.8 | 32.7 | 30.6 | 43.0 | 42.3 | 43.6 | 48.2 | 49.5 | 34.4 | 34.4 | 34.4 | — | 33.3 |
| | Hydrophobic group — Type | Methyl | Decyl | Methyl | Methyl | Methyl | Methyl | Methyl | Methyl | Methyl | Methyl | Methyl | — | — |
| | Hydrophobic group — Content [mass %] | 3.0 | 0.6 | 2.9 | 4.0 | 4.8 | 4.0 | 3.6 | 2.8 | 3.2 | 3.2 | 3.2 | — | 0 |
| | Aluminum compound (calculated as $Al_2O_3$) [mass %] | 4.7 | 4.8 | 4.5 | 5.9 | 5.9 | 4.8 | 5.9 | 4.8 | 5.9 | 5.9 | 5.9 | — | 4.8 |
| Mass ratio | Fine silica particles [mass ratio] | 67.7 | 65.0 | 65.0 | 50.0 | 50.0 | 50.0 | 45.0 | 45.0 | 60.0 | 60.0 | 60.0 | — | 65.0 |
| | Binder — Hydrolysis condensation product of hydrolyzable silicon compound containing no hydrophobic group [mass ratio] | 18.3 | 34.1 | 21.7 | 30.9 | 27.5 | 30.9 | 38.1 | 41.7 | 24.7 | 24.7 | 24.7 | — | 35.0 |
| | Hydrolysis condensation product of hydrolyzable silicon compound containing hydrophobic group [mass ratio] | 14.0 | 0.9 | 13.3 | 19.1 | 22.5 | 19.1 | 16.9 | 13.3 | 15.3 | 15.3 | 15.3 | | 0 |
| | Type of aluminum compound | $AlCl_3$ | $AlCl_3$ | $AlCl_3$ | $AlCl_3$ | $AlCl_3$ | $AlCl_3$ | $AlCl_3$ | $AlCl_3$ | $AlCl_3$ | $AlCl_3$ | $AlCl_3$ | | $AlCl_3$ |
| | Amount of aluminum compound calculated as a metal oxide ($Al_2O_3$) with respect to 100 parts by mass of silica component calculated as $SiO_2$ [Parts by mass] | 5 | 5 | 6.3 | 6.3 | 6.3 | 5.0 | 6.3 | 5 | 6.3 | 6.3 | 6.3 | | 5 |
| Properties | Thickness [nm] | 140 | 140 | 140 | 140 | 140 | 140 | 140 | 140 | 140 | 140 | 140 | — | 140 |
| | Average transmittance [%] | 82.55 | 82.65 | 82.55 | 82.46 | 82.47 | 82.47 | 82.24 | 82.24 | 82.60 | 82.60 | 82.60 | 80.00 | 82.68 |
| | Contact angle of water droplet [°] | 92.2 | 97.1 | 92.2 | 91.0 | 90.2 | 86.3 | 82.2 | 79.8 | 89.9 | 89.5 | 89.5 | 27.1 | 6.6 |
| | Difference determined by subtracting average transmittance obtained before adhesion of simulated contamination from average transmittance obtained after wiping off [%] | −0.1 | −0.2 | −0.1 | −0.2 | 0 | −0.3 | −0.7 | −0.4 | −0.1 | −0.1 | −0.1 | −0.2 | −2.4 |
| Contamination removal properties | Presence or absence of contamination examined after wiping off | Absent | Absent | Absent | Absent | Absent | Absent | Absent | Absent | Absent | Absent | Absent | Much | Much |
| | Scratches formed on low-reflection coating after wiping off | Present | Very few | Present | Absent | Absent | Absent | Absent | Absent | Absent | Absent | Absent | Absent | Absent |
| | Adhesion of contamination examined after allowing dust suspension to run down | Little | Little | Little | Little | Little | Little | Little | Little | Little | Little | Little | Much | Much |
| | Transmittance gain [%] | 2.55 | 2.65 | 2.55 | 2.46 | 2.47 | 2.47 | 2.24 | 2.24 | 2.60 | 2.58 | 2.58 | — | 2.68 |
| | Absolute value of difference in average transmittance before and after salt spray test [%] | — | — | — | 0.11 | 0.20 | — | — | — | 0.14 | — | — | — | 0.27 |
| Reflectance loss [%] | Before reciprocating wear test | — | — | — | 3.73 | 3.82 | 3.62 | 3.53 | 3.41 | 3.59 | 3.61 | 3.61 | — | 3.51 |
| | After reciprocating wear test | — | — | — | 2.53 | 2.33 | 2.39 | 2.44 | 2.53 | 2.02 | 2.02 | 2.02 | — | 1.55 |

INDUSTRIAL APPLICABILITY

The present invention makes it possible to provide a low-reflection coating that produces a high transmittance gain and that has good contamination removal properties.

The invention claimed is:

1. A low-reflection coating adapted to be provided on at least one principal surface of a substrate,
    the low-reflection coating being a porous film having a thickness that is more than 100 nm and smaller than or equal to 800 nm and comprising: fine silica particles being solid and spherical and having an average particle diameter that is more than 100 nm and smaller than or equal to 600 nm; and a binder containing silica as a main component and containing a hydrophobic group that consists of a chain alkyl group, the fine silica particles being bound by the binder, wherein
    the fine silica particles are contained in an amount of 35 to 70 mass %,
    the silica of the binder is contained in an amount of 25 to 64 mass %,
    the hydrophobic group of the binder is contained in an amount of 0.2 to 10 mass %,
    the silicon atoms of the binder are bonded with only one hydrophobic group,
    the fine silica particles are hydrophilic,
    the low-reflection coating produces a transmittance gain of 1.5% or more when provided on the substrate, the transmittance gain representing an increase in average transmittance of the substrate provided with the low-reflection coating relative to the substrate not provided with the low-reflection coating, the average transmittance being determined in the wavelength range of 380 to 850 nm, and
    a contact angle of a water droplet on the low-reflection coating is 70° or more.

2. The low-reflection coating according to claim 1, wherein
    the fine silica particles are contained in an amount of 50 to 70 mass %, and
    the silica of the binder is contained in an amount of 25 to 40 mass %.

3. The low-reflection coating according to claim 1, wherein
    the fine silica particles are contained in an amount of 35 to 55 mass %, and
    the silica of the binder is contained in an amount of 35 to 60 mass %.

4. The low-reflection coating according to claim 1, wherein the low-reflection coating further contains 2 to 7 mass % of an aluminum compound calculated as $Al_2O_3$.

5. The low-reflection coating according to claim 4, wherein the aluminum compound is derived from an aluminum halide added to a coating liquid for forming the low-reflection coating.

6. The low-reflection coating according to claim 4, wherein the aluminum compound is derived from aluminum nitrate added to a coating liquid for forming the low-reflection coating.

7. The low-reflection coating according to claim 1, wherein the low-reflection coating further contains 0.1 to 5 mass % of a phosphorus compound calculated as $P_2O_5$.

8. The low-reflection coating according to claim 1, wherein
    an absolute value of a difference between a first average transmittance of a substrate provided with the low-reflection coating and a second average transmittance of the substrate provided with the low-reflection coating is 0.25% or less,
    the first average transmittance is determined for light in the wavelength range of 380 to 850 nm after the substrate provided with the low-reflection coating is subjected to a salt spray test performed by spraying a 5 mass % aqueous sodium chloride solution having a temperature of 35° C. onto the low-reflection coating for 192 hours according to JIS C 8917: 2005, Annex 4, and
    the second average transmittance is determined for light in the wavelength range of 380 to 850 nm before the salt spray test.

9. The low-reflection coating according to claim 1, wherein
    a reflectance loss is 1.6% or more, the reflectance loss being determined by subtracting an average reflectance of the substrate provided with the low-reflection coating for light in the wavelength range of 360 to 740 nm from an average reflectance of the substrate not provided with the low-reflection coating for light in the wavelength range of 360 to 740 nm, and
    the average reflectance of the substrate provided with the low-reflection coating is determined after the substrate provided with the low-reflection coating is subjected to a reciprocating wear test performed by moving an abrasive wheel, CS-10F, in contact with the low-reflection coating at a load of 4 N with 50 cycles of reciprocation.

10. The low-reflection coating according to claim 1, wherein the hydrophobic group is contained in an amount of 0.5 to 8 mass %.

11. The low-reflection coating according to claim 1, wherein
    the hydrophobic group is derived from a hydrolyzable silicon compound, or a hydrolysate of the hydrolyzable silicon compound, added to a coating liquid for forming the low-reflection coating, the hydrolyzable silicon compound having a hydrophobic group directly bonded to silicon,
    the hydrolyzable silicon compound comprises a compound represented by the following formula (II):

$$RSiY_3 \qquad (II),$$

where
    Y is at least one selected from the group consisting of an alkoxy group, an acetoxy group, an alkenyloxy group, an amino group, and a halogen atom, and
    R is the hydrophobic group, and the hydrophobic group consists of the chain alkyl group that has 1 to 3 carbon atoms.

12. The low-reflection coating according to claim 1, wherein
    the silica of the binder is derived from a hydrolyzable silicon compound, or a hydrolysate of the hydrolyzable silicon compound, added to a coating liquid for forming the low-reflection coating, and
    the hydrolyzable silicon compound comprises a compound represented by the following formula (I):

$$SiX_4 \qquad (I),$$

where
    X is at least one selected from the group consisting of an alkoxy group, an acetoxy group, an alkenyloxy group, an amino group, and a halogen atom.

13. The low-reflection coating according to claim 1, wherein when an aqueous suspension of simulated dust is applied to the substrate provided with the low-reflection coating and dried to produce simulated contamination, the simulated contamination can be wiped off by rubbing with a dry cloth to the degree that the simulated contamination becomes invisible to naked eyes.

14. A glass sheet comprising the low-reflection coating according to claim 1.

15. A glass substrate comprising the low-reflection coating according to claim 1, the low-reflection coating forming one principal surface of the glass substrate, the glass substrate further comprising a transparent conductive film forming the other principal surface of the glass substrate opposite to the one principal surface.

16. A photoelectric conversion device comprising:
a glass sheet; and
the low-reflection coating according to claim 1, the low-reflection coating being formed on a principal surface of the glass sheet, wherein
the principal surface is a surface on which light is to be incident.

17. The low-reflection coating according to claim 1, wherein the chain alkyl group is methyl group.

18. The method of producing a low-reflection coating, comprising the step of;
applying a coating liquid for forming the low-reflection coating to a substrate, and
heating the substrate so that the substrate has a maximum temperature of 200° C. or higher and 350° C. or lower and that a duration during which the substrate has a temperature of 200° C. or higher is 5 minutes or less, wherein,
the low-reflection coating is a porous film having a thickness that is more than 100 nm and smaller than or equal to 800 nm and comprising: fine silica particles being solid and spherical and having an average particle diameter that is more than 100 nm and smaller than or equal to 600 nm; and a binder containing silica as a main component and containing a hydrophobic group that consists of a chain alkyl group, the fine silica particles being bound by the binder,
the fine silica particles are contained in an amount of 35 to 70 mass %,
the silica of the binder is contained in an amount of 25 to 64 mass %,
the hydrophobic group of the binder is contained in an amount of 0.2 to 10 mass %,
the silicon atoms of the binder are bonded with only one hydrophobic group, the fine silica particles are hydrophilic,
the low-reflection coating produces a transmittance gain of 1.5% or more when provided on the substrate, the transmittance gain representing an increase in average transmittance of the substrate provided with the low-reflection coating relative to the substrate not provided with the low-reflection coating, the average transmittance being determined in the wavelength range of 380 to 850 nm, and
a contact angle of a water droplet on the low-reflection coating is 70° or more.

19. The method of producing a low-reflection coating, comprising the step of;
applying a coating liquid for forming the low-reflection coating to a substrate, and
heating the substrate so that the substrate has a maximum temperature more than 120° C. and 250° C. or lower and that a duration during which the substrate has a temperature of 120° C. or higher is 3 minutes or less, wherein,
the low-reflection coating is a porous film having a thickness that is more than 100 nm and smaller than or equal to 800 nm and comprising: fine silica particles being solid and spherical and having an average particle diameter that is more than 100 nm and smaller than or equal to 600 nm; and a binder containing silica as a main component and containing a hydrophobic group that consists of a chain alkyl group, the fine silica particles being bound by the binder,
the fine silica particles are contained in an amount of 35 to 70 mass %,
the silica of the binder is contained in an amount of 25 to 64 mass %,
the hydrophobic group of the binder is contained in an amount of 0.2 to 10 mass %,
the silicon atoms of the binder are bonded with only one hydrophobic group, the fine silica particles are hydrophilic,
the low-reflection coating produces a transmittance gain of 1.5% or more when provided on the substrate, the transmittance gain representing an increase in average transmittance of the substrate provided with the low-reflection coating relative to the substrate not provided with the low-reflection coating, the average transmittance being determined in the wavelength range of 380 to 850 nm, and
a contact angle of a water droplet on the low-reflection coating is 70° or more.

* * * * *